(12) United States Patent
Moore et al.

(10) Patent No.: US 10,176,963 B2
(45) Date of Patent: Jan. 8, 2019

(54) METHOD AND APPARATUS FOR ALIGNMENT OF OPTICAL AND CHARGED-PARTICLE BEAMS IN AN ELECTRON MICROSCOPE

(71) Applicant: Waviks, Inc., Dallas, TX (US)

(72) Inventors: Thomas M. Moore, Dallas, TX (US);
Gregory A. Magel, Dallas, TX (US)

(73) Assignee: Waviks, Inc., Dallas, TX (US)

( * ) Notice: Subject to any disclaimer, the term of this patent is extended or adjusted under 35 U.S.C. 154(b) by 0 days.

(21) Appl. No.: 15/836,390

(22) Filed: Dec. 8, 2017

(65) Prior Publication Data

US 2018/0166247 A1   Jun. 14, 2018

Related U.S. Application Data

(60) Provisional application No. 62/431,937, filed on Dec. 9, 2016.

(51) Int. Cl.
*H01J 37/02* (2006.01)
*H01J 37/20* (2006.01)
(Continued)

(52) U.S. Cl.
CPC ............ *H01J 37/023* (2013.01); *H01J 37/02* (2013.01); *H01J 37/06* (2013.01); *H01J 37/20* (2013.01);
(Continued)

(58) Field of Classification Search
CPC .......... H01J 37/023; H01J 37/02; H01J 37/06; H01J 37/20; H01J 37/22; H01J 37/226; H01J 37/244; H01J 37/28
See application file for complete search history.

(56) References Cited

U.S. PATENT DOCUMENTS

| | | | |
|---|---|---|---|
| 4,349,242 | A | 9/1982 | Ogura |
| 4,440,475 | A | 4/1984 | Colliaux |

(Continued)

OTHER PUBLICATIONS

Leica Microsystems, Correlative light and electron microscopy, John Wiley & Sons Ltd. Essential Knowledge Briefings, 2d Edition, 2015, West Sussex, UK.

(Continued)

*Primary Examiner* — Eliza Osenbaugh-Stewart
(74) *Attorney, Agent, or Firm* — John A. Thomas

(57) ABSTRACT

Apparatus and methods for the alignment of a charged-particle beam with an optical beam within a charged-particle beam microscope, and to the focusing of the optical beam are disclosed. An embodiment includes a charged-particle beam microscope having one or more charged-particle beams, such as an electron beam, and one or more optical beams provided by an optical-beam accessory that is mounted in or on the charged-particle beam microscope. This accessory is integrated into a nanomanipulator system, allowing its focus location to be moved within the microscope. The apparatus includes a two-dimensional pixelated beam locator such as a CCD or CMOS imaging array sensor. The image formed by this sensor can then be used to manually, or automatically in an open or closed loop configuration, adjust the positioning of one or more charged-particle beams or optical beams to achieve coincidence of such beams or focus of one or more such beams.

41 Claims, 10 Drawing Sheets

(51) Int. Cl.
*H01J 37/22* (2006.01)
*H01J 37/244* (2006.01)
*H01J 37/06* (2006.01)
*H01J 37/28* (2006.01)

(52) U.S. Cl.
CPC ............ *H01J 37/22* (2013.01); *H01J 37/226* (2013.01); *H01J 37/244* (2013.01); *H01J 37/28* (2013.01); H01J 2237/024 (2013.01); H01J 2237/063 (2013.01); H01J 2237/202 (2013.01)

(56) References Cited

U.S. PATENT DOCUMENTS

| | | |
|---|---|---|
| 4,537,477 A | 8/1985 | Takagi et al. |
| 5,905,266 A | 5/1999 | Larduinat et al. |
| 6,373,070 B1 | 4/2002 | Rasmussen |
| 6,552,341 B1 | 4/2003 | Desplats et al. |
| 6,683,316 B2 | 1/2004 | Schamber et al. |
| 7,671,333 B2 | 3/2010 | Agronskaja et al. |
| 8,350,227 B2 | 1/2013 | Doemer et al. |
| 8,440,969 B2 | 5/2013 | Moore et al. |
| 8,530,856 B2 | 9/2013 | Spruck et al. |
| 8,558,174 B2 | 10/2013 | Doemer et al. |
| 2003/0025087 A1 | 2/2003 | Schamber et al. |
| 2008/0283777 A1 | 11/2008 | Herschbein et al. |
| 2012/0025075 A1* | 2/2012 | Moore ................. G02B 21/002 250/307 |
| 2012/0133757 A1 | 5/2012 | Thomas et al. |
| 2013/0284924 A1 | 10/2013 | Mizuochi et al. |
| 2015/0108350 A1 | 4/2015 | Hoogenboom et al. |
| 2015/0214001 A1 | 7/2015 | Buijsse |
| 2015/0262784 A1* | 9/2015 | Hoogenboom ....... H01J 37/222 250/307 |
| 2017/0018399 A1 | 1/2017 | De Jonge |

OTHER PUBLICATIONS

Voortman, Lenard, Integration Without Compromise, Microscopy Today, pp. 30, 32-34, Nov. 2014.
De Boer, Pascal, et al., Correlated light and electron microscopy: ultrastructure lights up!, Nature Methods, vol. 12, No. 6, pp. 503-513, Jun. 2015.

* cited by examiner

METHOD AND APPARATUS FOR ALIGNMENT OF OPTICAL AND CHARGED-PARTICLE BEAMS IN AN ELECTRON MICROSCOPE

CLAIM FOR PRIORITY

This application claims the priority of U.S. provisional patent application Ser. No. 62/431,937, filed Dec. 9, 2016, the entire disclosure of which is incorporated into the present application by reference.

BACKGROUND

Technical Field

This disclosure is directed to apparatus and methods for the alignment of an optical beam with a charged-particle beam within a charged-particle beam microscope, and to the focusing of the optical beam.

BACKGROUND

For more than 400 years, scientists have investigated living organisms and cells with light microscopes. The more recent development of electron microscopy has improved the spatial resolution available to scientists by three orders of magnitude. Most recently, the bridging of these forms of microscopy has involved Correlative Electron and Light Microscopy (CLEM). One approach to CLEM has been to overlap in a charged-particle beam microscope the focused spots of a charged-particle beam, such as an electron beam in a Scanning Electron Microscope (SEM), and an optical beam, such as a focused laser. Once these two beam spots are overlapping in space and focused on the surface of a sample, the sample can be mechanically scanned in a square raster pattern. In this way multiple images that result from the interaction of the optical beam and the electron beam with the sample can be created that are perfectly registered with each other on a pixel-by-pixel basis.

This perfect registration provides an excellent method for comparing the contrast obtained from the optical and electron-beam interactions with the sample. However, the initial alignment of the optical and electron beams is difficult in a charged-particle beam microscope, such as an SEM, because these microscopes are designed to image secondary and backscattered electrons that are produced by the primary electron beam. An apparatus and method is needed to quickly align the optical and electron beams, and focus the optical beam in CLEM applications. In a second example of combined charged-particle and optical spots in a charged-particle beam microscope, in the field of semiconductor manufacturing, it is often necessary during the development of a new chip design to make edits in the prototype circuit to verify the correction of design errors before an investment is made in another set of expensive optical lithography masks. This design-edit function is typically done using a charged-particle microscope to cut traces and deposit new conductive traces with chemical vapor deposition (CVD). CVD deposits have the serious drawback, however, that the material deposited contains impurities having insulating characteristics. The result is that, due to the increased resistivity of the new conductive traces, the modified circuit usually cannot be tested as a standard chip would be tested, and thus the design edit cannot be completely confirmed. It has been found that irradiating and heating such CVD deposits with laser energy will reduce such impurities and thus enable more reliable circuit testing, greatly improving the efficiency of the design-edit function. It is desirable to focus the laser beam so as to target small areas of interest, and also to maximize the optical irradiance on the sample for efficient processing.

Thus, an apparatus and method are also needed to accurately and quickly align a charged-particle beam with a laser beam in a charged-particle beam microscope and focus the beams so that the benefits of applying laser energy to the same location on a chip can be exploited. Further, such alignment should be automated as much as possible to further speed up the alignment process.

DRAWINGS

Non-limiting embodiments of the present disclosure are described by way of example in the accompanying drawings, which are schematic and are not intended to be drawn to scale:

Figure 6:
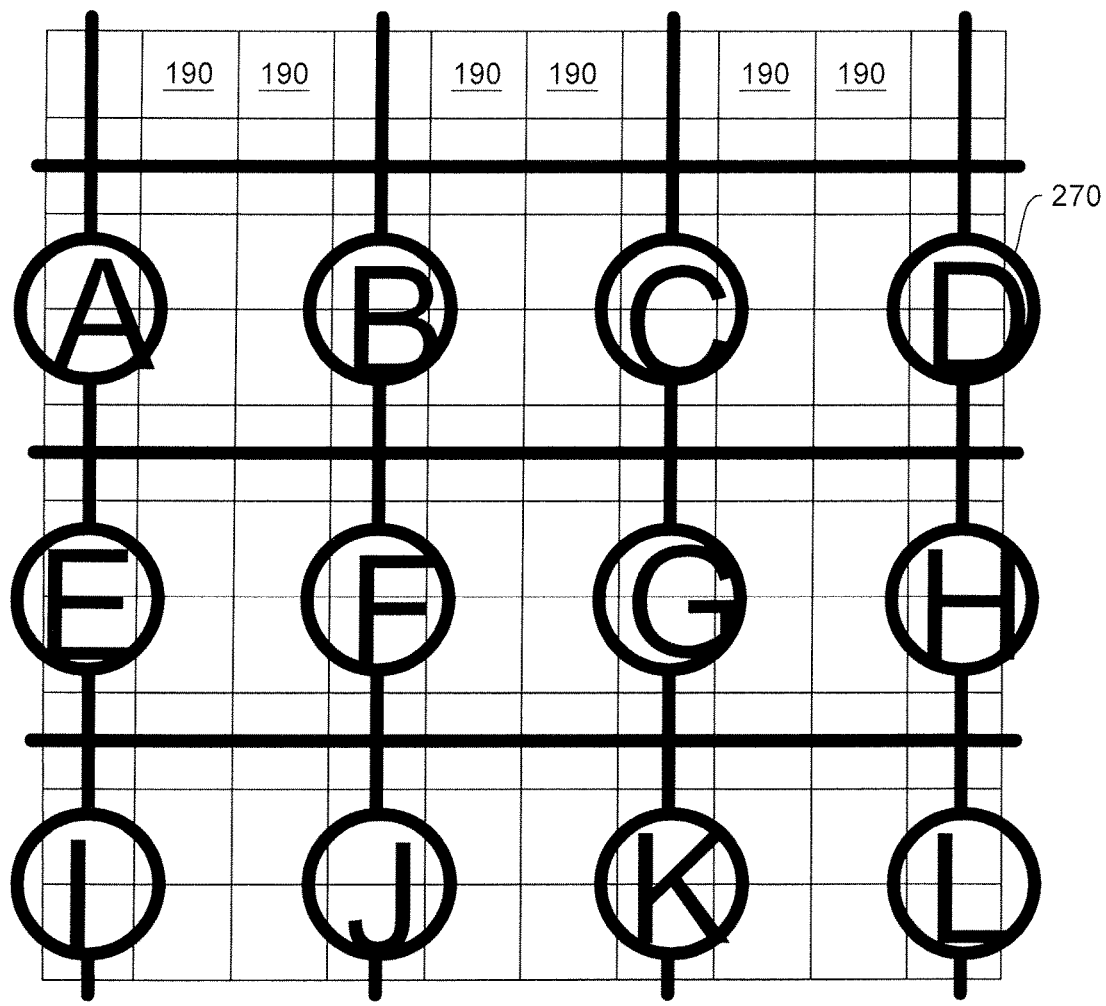

FIG. 6 a schematic plan view depicting a portion of a two-dimensional pixelated beam locator, showing an alpha-numeric fiducial pattern placed over portion of a pixel array.

Figure 7A:
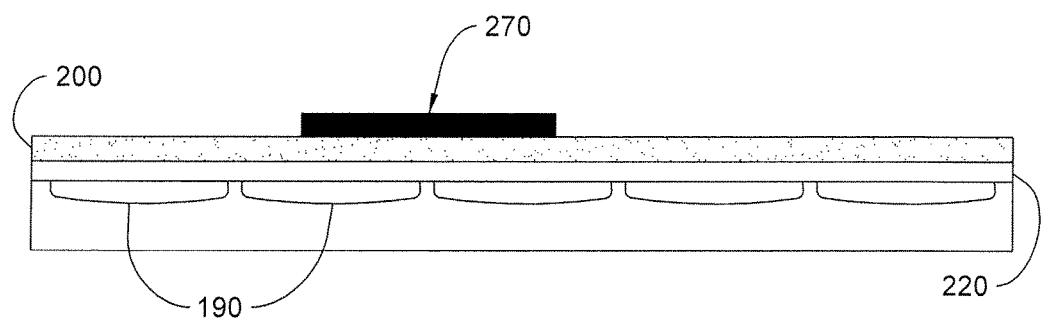
Figure 7B:
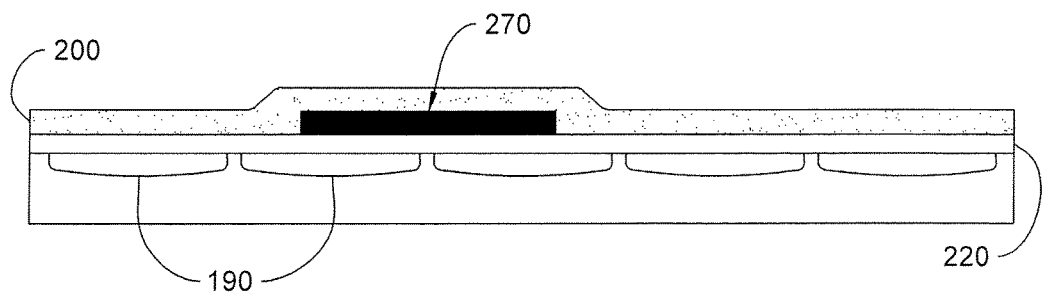

FIGS. 7A and 7B are cross-sections of a two-dimensional pixelated beam locator having one or more fiducials on its surface, over and under an optional fluorescent layer, respectively.

Figure 8A:
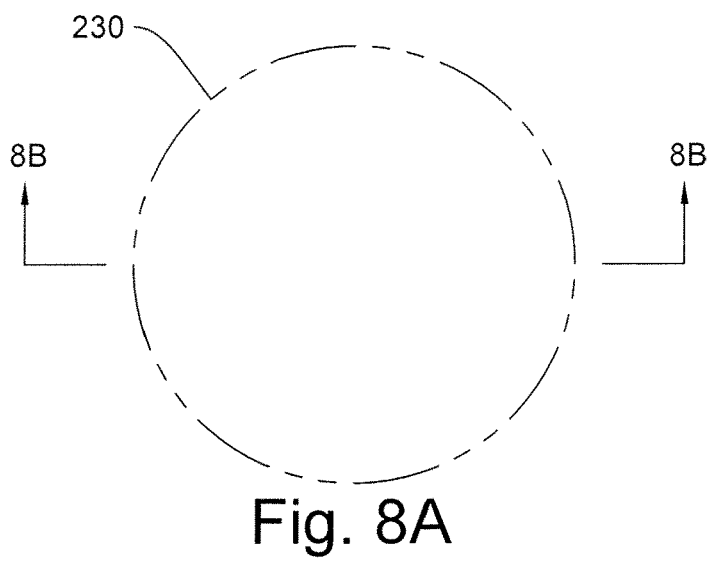
Figure 8B:
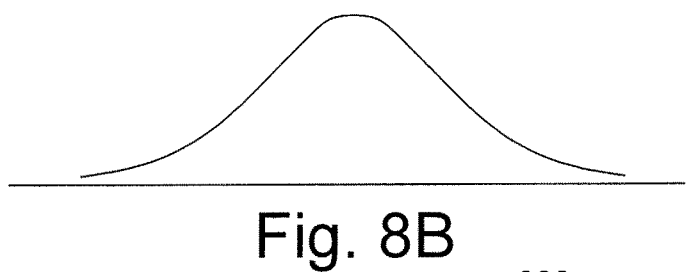

FIGS. 8A and 8B are schematic diagrams showing respectively, the extent of a circular beam spot in plan view and a plot of irradiance as a function of position across the beam.

Figure 8C:
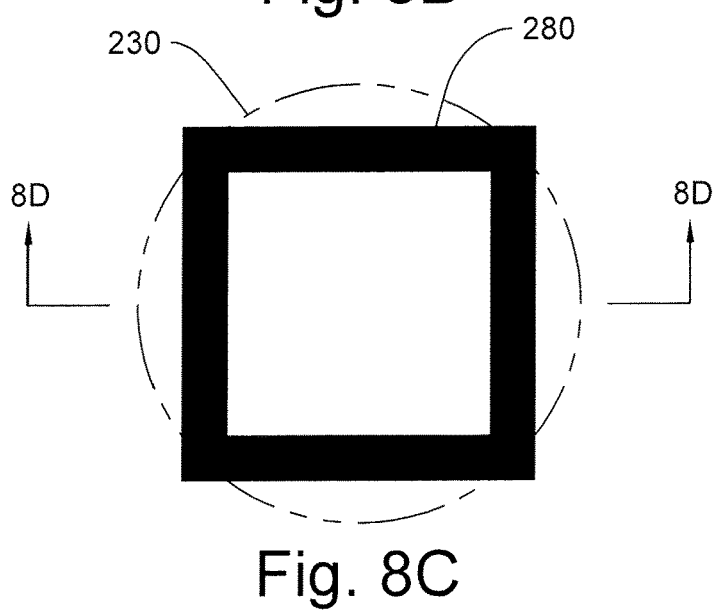
Figure 8D:
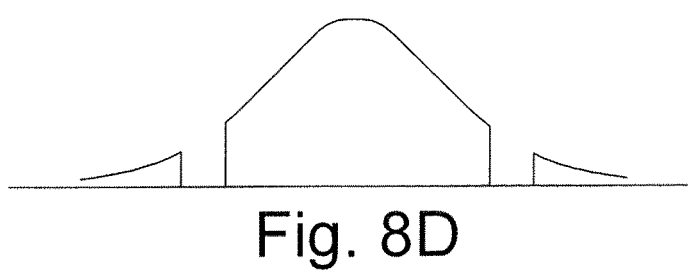

FIGS. 8C and 8D are schematic diagrams showing, respectively, the extent of a beam spot across a ring fiducial and a plot of irradiance as a function across such beam.

Figure 9:
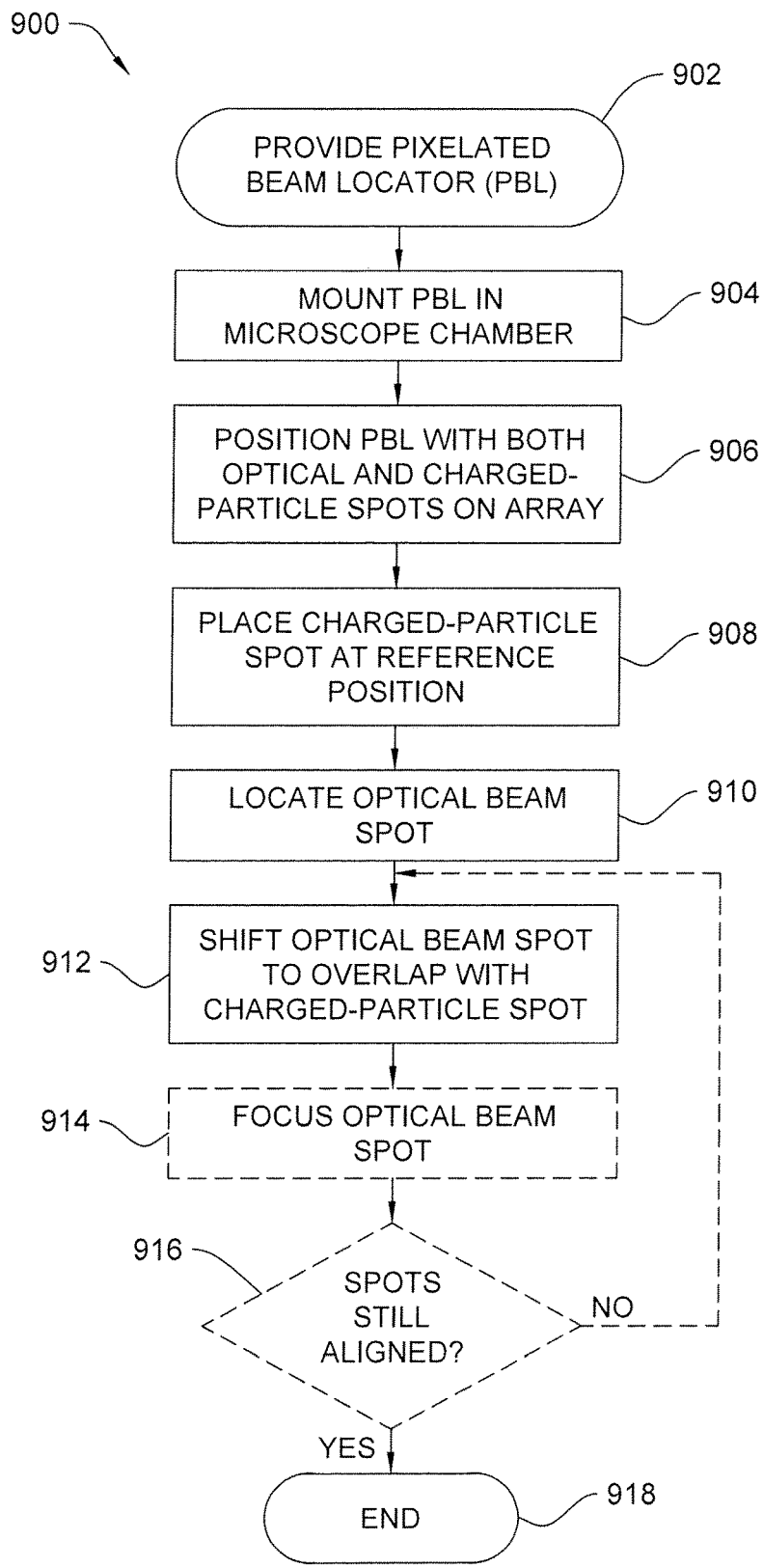

FIG. 9 is a flow chart illustrating a method for alignment of an optical beam with a charged-particle beam within a charged-particle beam microscope according to an embodiment of the present invention.

Figure 10:
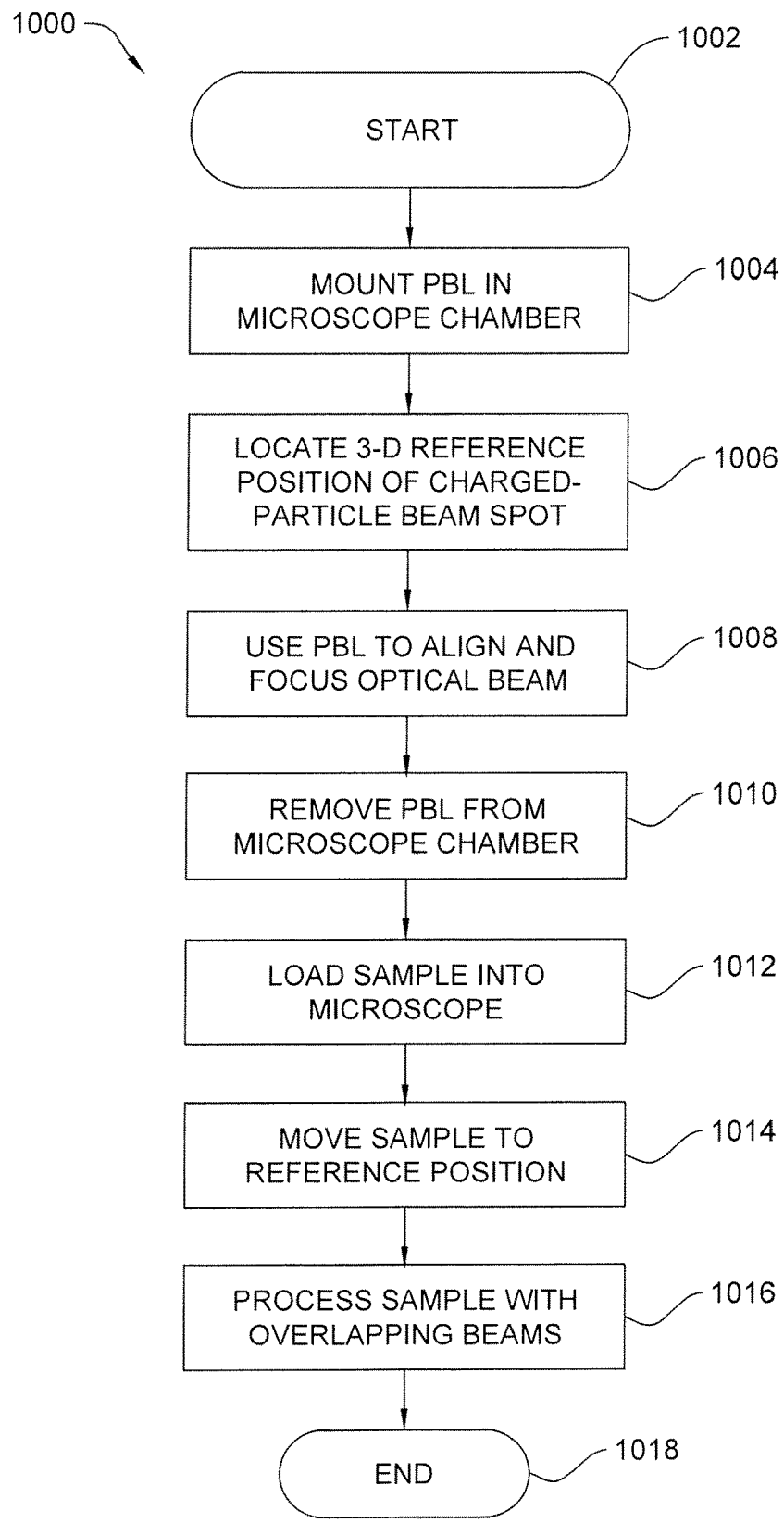

FIG. 10 is a flow chart illustrating a method for alignment of an optical beam with a charged-particle beam according to another embodiment of the present invention.

DETAILED DESCRIPTION

This disclosure is directed to apparatus and methods for the automated alignment of a charged-particle beam 110 with an optical beam 120 within a charged-particle beam 110 microscope, and to the focusing of the optical beam 120. As shown schematically in FIG. 1, an embodiment of the apparatus includes a charged-particle beam microscope 100 with one or more charged-particle beams 110, such as an electron beam, and one or more optical beams 120 provided by an optical-beam accessory 125 that is integrated into, or mounted in or on the charged-particle beam microscope 100. The optical-beam accessory 125 is integrated into a nanomanipulator system 135, allowing its focus location to be moved within the microscope 100. A suitable nanomanipulator that can be readily adapted to this purpose is the Oxford Instruments Omniprobe Model 200. Charged-particle beam 110 and optical beam 120 are shown incident upon sample 130. Sample 130 in some embodiments may be mounted on a sample holder 145 that may be removably attached to microscope stage 140 used for positioning sample 130 within charged-particle beam microscope 100. The charged-particle beam microscope 100 can be, but is not limited to, a scanning electron microscope (SEM), a helium ion beam microscope (HIM), a focused ion beam microscope (FIB), a combined SEM/FIB, a transmission electron microscope (TEM), or a microscope with any combination or plurality of charged-particle beams 110. The optical beam accessory 125 can be, for example, an optical microscope, a scanning laser microscope, a laser spot heating system, an optical beam 120 for analytical purposes, or any combination or plurality of these. An example of such an optical beam accessory 125 is the Vesta™ laser sample-heating system manufactured by Waviks, Inc. of Dallas, Tex., USA. (In this disclosure, reference to a "beam" may be taken to include one or more beams, unless otherwise stated.) Other parts of the charged-particle microscope system 100, that may or may not be present as separate pieces of equipment or integrated into fewer chassis, are also indicated in the schematic diagram of FIG. 1: microscope controller (e.g. a personal computer) 170, master controller 175 for the optical beam accessory 125, power and pulse controller 160 for a laser or other light source, and nanomanipulator motion controller 150.

The apparatus for alignment of a charged-particle beam 110 and an optical beam 120 includes a two-dimensional pixelated beam locator 180 (also referred to herein as a "PBL") such as, but not limited to, a CCD or CMOS imaging array sensor chip. Unless otherwise distinguished, the terms "PBL" or "imaging array 180" are used interchangeably in this disclosure. A cross-sectional view of a typical PBL 180 is shown schematically in FIG. 2. The choice for semiconductor material for the PBL 180 may be determined by the characteristic spectral sensitivities of the semiconductor candidates, and includes but is not limited to, silicon (Si), gallium arsenide (GaAs), indium gallium arsenide (InGaAs), or indium arsenide (InAs). The imaging array 180 may be front-side or back-side illuminated. In one embodiment, the PBL 180 contains a fluorescent coating 200 on its surface that is at least partially transparent to the optical beam 120 and that fluoresces when irradiated with a charged-particle beam 110. This fluorescent coating 200 is thin enough that the fluorescent light emitted from the fluorescent coating 200 is transmitted from the underside of the fluorescent coating 200 facing the imaging array 180 to the imaging array element (pixel) 190 that is in close proximity to the location where the charged-particle beam 110 irradiates the surface of the PBL 180.

Figure 3:
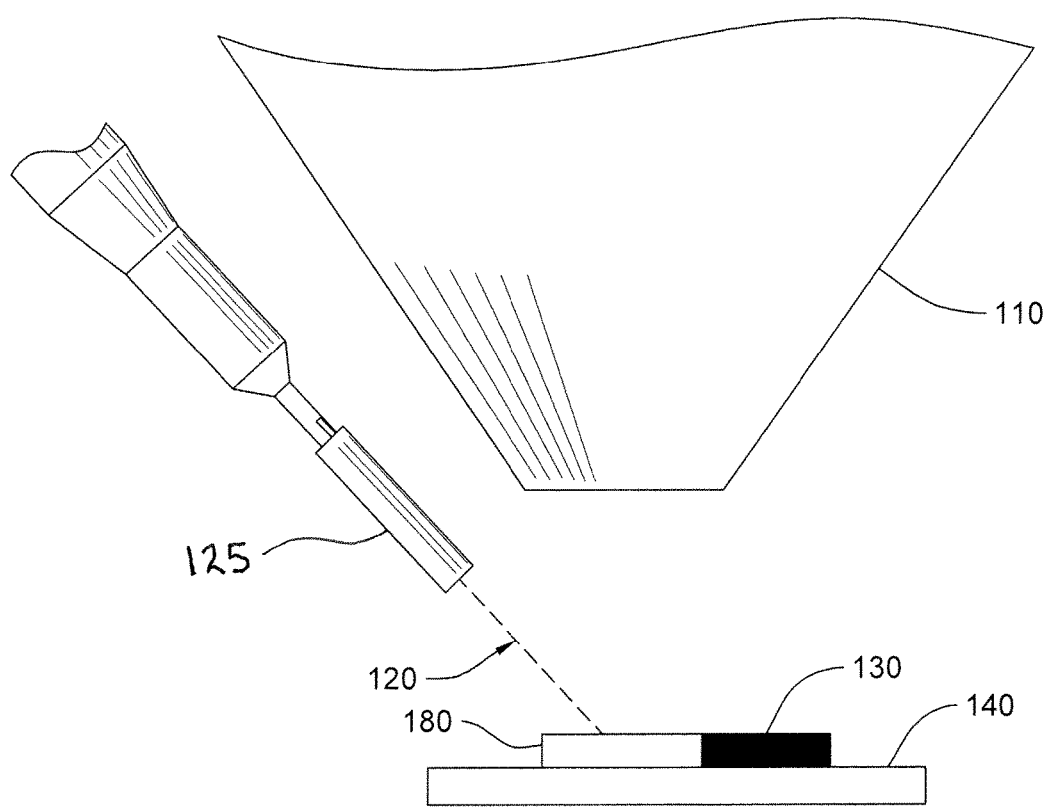
FIG. 3 is a side view of an exemplary apparatus for alignment of a charged-particle beam and an optical beam.
Figure 4A:
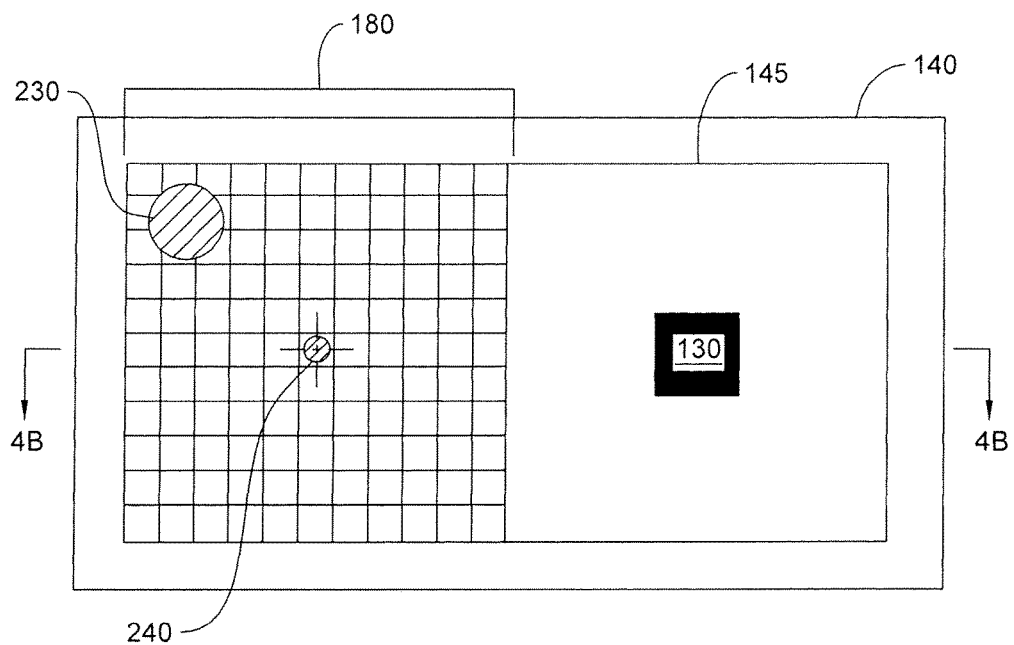
FIG. 4A shows a plan view of an example of how a two-dimensional pixelated beam locator may be mounted in close proximity to a sample.
Figure 4B:
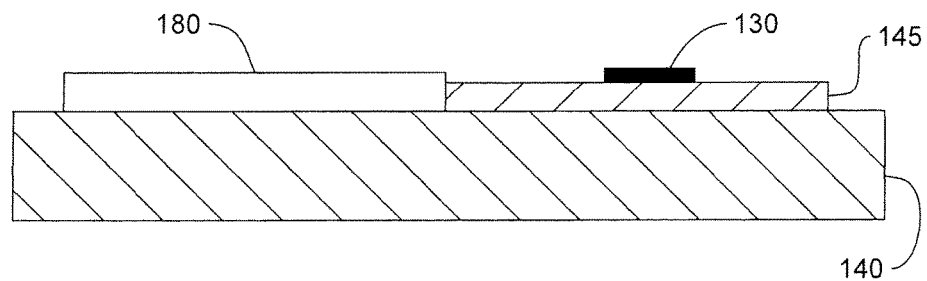
FIG. 4B shows a side view of the example depicted in FIG. 4A.
Figure 5A:
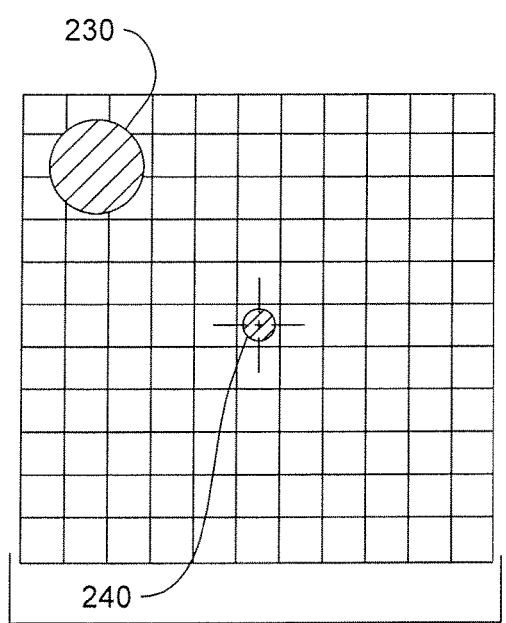
FIG. 5A is a plan view of the PBL imaging array showing an initial unfocused and unaligned optical spot, and a centered charged-particle beam spot incident on its surface.
Figure 5B:
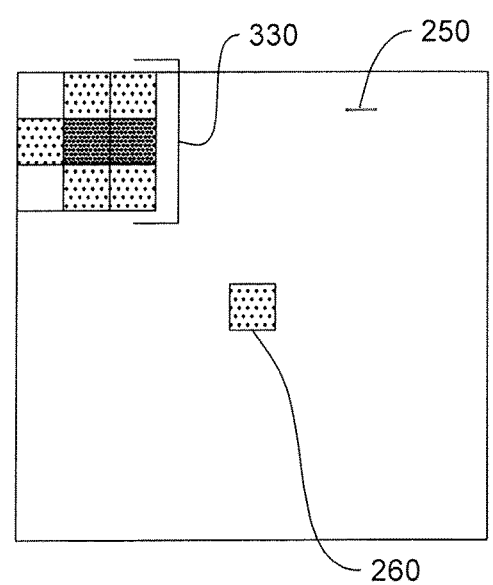
FIG. 5B is a representation of an electronic image produced by the PBL imaging array showing an image corresponding to the unfocused and unaligned optical spot, and the charged-particle beam spot incident on its surface.

The PBL 180 is contained within the vacuum chamber of the charged-particle beam microscope 100. In one embodiment, the PBL 180 can be mounted so that the exposed surface of the PBL 180 is coplanar with the exposed surface of a sample 130 as illustrated in FIGS. 3 and 4. Typically, the sample 130 will be a semiconductor circuit or circuit part, although it could be the surface of any material placed into the charged-particle beam microscope. For example, if the sample 130 is mounted on the microscope sample holder 145 in close proximity to the PBL 180 so that the surfaces of both lie in the same plane, then the alignment of the charged-particle beam 110 and the optical beam 120 achieved with the PBL 180 may be maintained when the sample holder 145 is translated by the microscope stage 140 in the plane that contains the surface of the sample 130 and the surface of the PBL 180, to expose the surface of the sample 130 to the imaging beams 110, 120, without altering the focus or positioning of the charged-particle beam 110 and the optical beam 120. When the imaging array 180 is exposed to the charged-particle beam 110 or the optical beam 120, the signals from the PBL 180 produced by the interaction of one or both beams with the PBL 180 will be apparent in the electronic image pattern 250 produced by the PBL 180, as shown in FIGS. 5A and 5B. This electronic image 250 can then be used to manually, or automatically in a closed loop configuration, adjust the positioning of one or more charged-particle beams 110 or optical beams 120 to achieve coincidence of such beams 110, 120, or focus of one or more such beams 110, 120, as discussed in more detail below.

FIG. 5A shows a plan view of the PBL imaging array 180 with a charged-particle beam spot 240 centered in the array, and with an optical beam spot 230, which may be unfocused at the beginning of an alignment process, incident out toward one of corner of the array. The electronic image 250 generated by the PBL 180 is represented in FIG. 5B with one pixel corresponding to the charged-particle beam spot image 260 highlighted darker in the center, indicating high incident intensity on that pixel 190. Similarly, the image 330 of the optical beam spot shows darker pixels 190 where the optical beam 120 has higher intensity. After an alignment procedure is performed, both beam spot images 330 and 260 may be substantially centered on the same location on PBL 180 and thus in the image 250, and after focusing, the optical beam spot image 330 may be smaller in lateral extent in image 250.

It may be possible to distinguish the responses of the PBL 180 caused by irradiation by a charged-particle beam 110 or an optical beam 120, depending on the type or configuration of imaging array 180 used, or due to the relative difference in the sizes of the focused spot 240 of a charged-particle beam 110 and the focused spot 230 of an optical beam 120. For example, depending on the type of imaging array 180 selected, such as a color image sensor, and the wavelength of the optical beam, the image 330 produced by the optical beam spot 230 may be perceived as having a specific color in the image 250 produced by the PBL, and this specific color corresponding to the optical beam may appear to be a different color from that of image 260 produced by the charged-particle beam spot 240.

As an alternative way to distinguish the images of the optical and charged-particle beam spots 330 and 260, the exposure of the PBL 180 to a charged-particle beam 110 and an optical beam 120 may be synchronized in time in such a way that each beam may be independently detected and recognized. For example, the optical beam 120 could be pulsed on and off while the charged-particle beam 110 is kept on continuously. For example, for detection by a human operator, the optical beam 120 can be pulsed with a 1 Hz repetition rate and with a 50% duty cycle. For automated detection, a pulse timing pattern appropriate for the speed and bandwidth of the PBL electronics can be selected for the optical beam 120. Alternatively, both beams 110, 120 can be pulsed with different pulse timing patterns.

Since the size of a focused optical beam 120 spot 230 may be similar in size to, or larger than, the pixel size of a typical commercially-available imaging array 180 (for example, a 2.5 µm pixel size in the imaging array), the PBL 180 may also be used to focus the optical beam 120 by adjusting the focus of the optical beam 120 until the size of the optical spot 230 detected by the PBL 180 is minimized. In other words, focus of the optical spot 120 is achieved when the number of pixels in the image produced by the PBL 180 is minimized. This focusing feature is available also for focusing a charged-particle beam 110, but since most commercially available charged-particle beam microscopes offer spot sizes less than 10 nm, this is more likely to be useful for focusing the optical beam spot 230, at least using current imaging arrays 180, than for focusing the charged-particle beam spot 240. The focusing of one or more beams 110, 120 and the alignment of multiple charged-particle beams 110 and optical beams 120 can be accomplished manually, or combined in a partially or fully-automated sequence, e.g. under software control of beam pointing and stage position, and using software interpretation of the output of the imaging array 180. An example of a method for aligning the optical beam spot 230 with the charged-particle beam spot 240 that can be automated will be described later in the discussion of FIG. 9.

The PBL 180 may be placed in position with respect to the sample 130 within the charged-particle beam microscope 100 in one or more of the following ways: in, or attached to, the sample stage 140 of the charged-particle beam microscope 100; or in a sample holder 145 that is removably mounted on the microscope sample stage 140. The plane of the image imaging array 180 surface may be substantially parallel to the plane of the sample 130 surface, or the image imaging array 180 surface may be on substantially the same level (relative to the stage Z axis) as the sample 130 surface, as illustrated in FIGS. 3 and 4.

As shown in FIG. 4, it may be desirable to place the PBL imaging array 180 in close proximity to the sample 130 in order to minimize stage motion when switching between the PBL 180 and the sample 130. This may improve the accuracy of X and Y axis positioning, as well as allow quicker repositioning between PBL 180 and sample 130 positions during setup.

The PBL 180 can also be used separately, without the sample 130 close-by, or even without the sample 130 in the chamber of the microscope 100 at all, to find the coincidence and focus of the optical beam 120 and charged-particle beam 110 prior to mounting a sample 130, as will be described later with reference to FIG. 10.

The PBL 180 inside the microscope vacuum chamber 100 can be wired directly to a power supply, computer or display outside the microscope 100 by passing the electrical connections through the vacuum chamber of the microscope with a vacuum electrical feed-through. Alternatively, the PBL 180 can be connected wirelessly to an external computer or display, and powered locally with a battery. The wireless connection can be accomplished using a commercially available wireless communication standard such as, but not limited to, Bluetooth (the Bluetooth Special Interest Group, IEEE 802.15.1, or WiFi (the WiFi Alliance, IEEE 802.11)).

Color or black-and-white imaging arrays 180 may be used. Black-and-white arrays may offer superior spatial resolution, but color arrays may offer improved simultaneous capability to distinguish the beams. Depending on the type and design of imaging array 180 used, the response of the imaging array 180 to the charged-particle beam 110 may be different from the response to the optical beam 120 so that a different grey scale, or a different color, can be assigned to the appropriate pixels 190 in the image 250 produced by the PBL 180, thus enabling simultaneous detection of the charged-particle beam 110 beam and the optical beam 120.

Referring again to FIG. 2, the imaging array 180 may have a clear protective overcoat 220 to protect the photosensitive imaging array 180 elements. This optically transparent and insulating protective overcoat 220 may be removed or thinned in some embodiments to improve sensing of the charged-particle beam 110 or to improve optical beam 120 position resolution, or both. In the case of a protective optically-transparent overcoat 220 over the imaging array 180, as discussed below, a fluorescent coating 200, such as a phosphor, may be applied over the imaging array 180 elements to facilitate detection of charged-particle beam 110 position by converting the charged-particle beam 110 position to an optically-fluorescent spot 260 for optical detection by the imaging array 180 through the protective overcoat. In addition, a conductive layer 210 that is transparent to the optical beam 120 and easily penetrated by the particle beam 110 may optionally be deposited on top of such a fluorescent coating 200 to prevent charging of the sample 130 that could result in distortion or deflection of the measured charged-particle beam spot 110. An example of such an electrically-conductive thin layer that is sufficiently transparent to visible light and to a 20 keV electron beam, which is typical for an SEM, is indium tin oxide (ITO), which is composed roughly of 74% In, 18% $O_2$, and 8% Sn by weight, and which can be deposited by electron beam evaporation in sufficiently thin layers (<100 nm) to be transparent to the electron beam 110 in an SEM. It may be desirable to include a conductive layer 210 over the imaging array 180 whether or not the imaging array 180 has a protective overcoat 220 or an additional fluorescent coating 200. If the imaging array 180 is damaged, e.g. by hitting it with a laser beam 120 that is too powerful, other areas of the imaging array 180 can still be used equivalently. Thus replacement of the imaging array 180 will not necessarily be required if it is damaged in one area but otherwise continues to be functional.

Excessive power in the laser beam 120 during alignment and focusing may be prevented manually, or by features built into software that controls the laser 125 during an alignment procedure. In some embodiments, control software may be provided that adjusts optical beam 120 parameters such as laser power or pulse parameters or both, for optimal imaging of the laser spot 230 by the imaging array 180. Laser power (which is measured by the optical beam 120 irradiance incident upon the imaging array 180) or pulse parameters may be adjusted automatically by such software during the alignment procedure. This optical beam 120 adjustment feature may be included in a software implementation or automation of all, or at least part, of the alignment procedure.

Several embodiments including devices and methods for alignment using the imaging array 180 that rely on either direct or indirect detection of one or more of the incident beams 110, 120 are described in the following paragraphs.

Activation of Direct Imaging Array by Both Incident Beams

Figure 2:
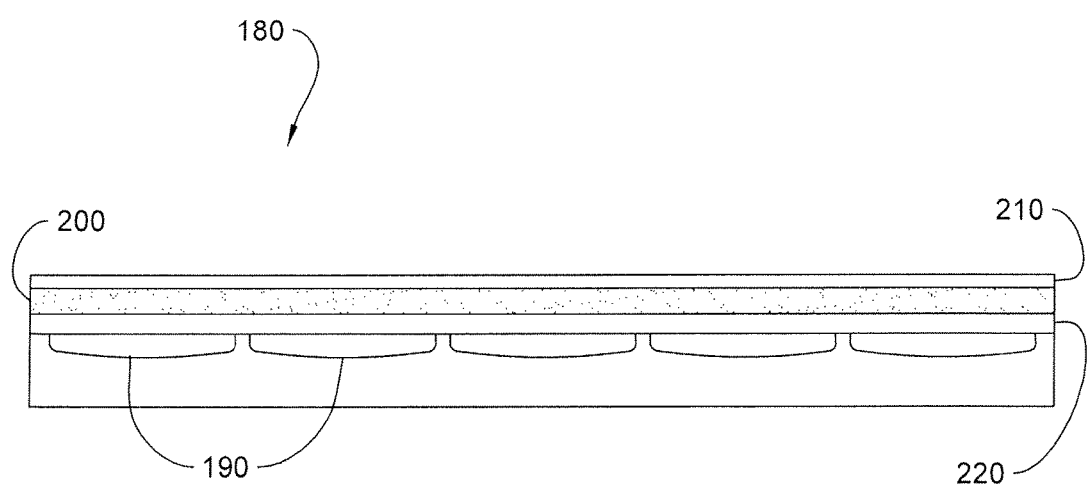
FIG. 2 is a cross-sectional side view of an exemplary two-dimensional pixelated beam locator according to an embodiment of the present invention.

In some embodiments, the pixels 190 of the PBL 180 are directly and locally sensitive to both charged-particle beams 110 and optical beams 120. In this case, both beam types activate the pixels in the imaging array 180. Any protective overcoat 220 covering the pixels 190 should be at least partially transparent to both the charged-particle beams 110 and optical beams 120 employed. In some cases, and depending on the type of imaging array 180 being used, any thick optically transparent layers, such as protective overcoat 220 or protective filters and coatings developed for the digital or video camera market, may have to be thinned or removed from the imaging array 180 to allow the charged-particle beam 110 to penetrate into the active area of the imaging array 180. If the protective coatings and optical filters cannot be practically removed from the imaging array 180, then an optically transparent fluorescent coating 200 can be applied over the imaging array 180 to convert the charged-particle beam 110 spot to an optical signal, as will be described later. Also, to limit charge buildup from the charged-particle beam 110 on the surface of the imaging array 180, an electrically conductive coating 210 that is not opaque to either the charged-particle beam 110 or the optical beam 120 may be needed as the top layer. Such coatings are illustrated in FIGS. 2 and 6.

As an alternative to the simultaneous detection and distinguishing of the signals from different incident beams 110, 120, at least one of the incident beams 110, 120 may be pulsed on and off or modulated as a function of time in such a way or sequence that facilitates detection and the unique identification of each beam spot.

Sub-pixel resolution of the position of the centroid of the charged-particle beam spot 240 or the optical beam spot 230 may be calculated using image processing algorithms well-known to those skilled in the art and used in machine vision applications and microscopy for finding the centroid or geometric center of a plane figure. Commonly-achievable resolutions and accuracies are a small fraction of the pitch of the pixels 190, such as 0.1 pixel, 0.01 pixel, even 0.001 pixel and below.

Fluorescent Coating over Imaging Array

In another embodiment, the PBL 180 further comprises a fluorescent coating 200 on its surface that is at least partially transparent to the optical beam 120 and that fluoresces optically when irradiated with charged-particle beam 110. The fluorescent coating 200 may be made of a phosphor material, e.g. a phosphor of a type used in cathode-ray tubes. This fluorescent coating 200 is preferably thin enough for the fluorescent light emitted from the coating 200 when the charged-particle beam 110 interacts with it to be transmitted to the bottom side of the coating 200 that is in contact with the imaging array 180, to illuminate array pixels 190 that are in close proximity to the location where the charged-particle beam 110 is irradiating the surface of the PBL 180. In this embodiment, the charged-particle beam 110 position is detected by the imaging array 180 by detecting the associated fluorescence stimulated in the fluorescent coating 200 by the particle beam 110. In this way, an imaging array 180 is constructed that is simultaneously sensitive to particle beam 110 and optical beam 120.

Alignment Aided by Fiducial Marks or Patterns on the Imaging Array

A fiducial is a reference mark placed on the imaging array 180 that is visible, that is, that may be imaged by either one or both (electrons or ions) of the microscope charged-particle beams 110 using, for example, secondary electrons, or by the PBL 180 using optical or charged-particle illumination. Fiducial patterns can be specifically designed to optimize the accuracy of positions found by analyzing the image of the fiducial using, e.g. machine vision software image processing algorithms. Alternatively, fiducial patterns having a unique and recognizable shape can facilitate finding position on the array 180.

In one embodiment, a pattern 270 of fiducial marks that can be imaged by the charged-particle beam 110 is deposited or adhered onto the surface of the PBL 180, or etched into the surface of the PBL 180. One example of a fiducial pattern 270 that can be used in this way is illustrated in FIG. 6. The fiducial pattern 270 may be, for example an indexed TEM grid. The position and dimensions of this fiducial pattern 270 of marks relative to the pixels 190 in the underlying PBL 180 may be ascertained in a calibration step prior to use by identifying an optical shadow of the pattern 270 in the PBL 180 image. If the fiducial pattern 270 is indexed with alphanumeric labels, as shown in the example of FIG. 6, then even at a relatively high magnification, the location of the charged-particle beam 110 can be determined in the charged-particle beam 110 image. During alignment, the charged-particle beam 110 image can be compared with the fiducial pattern 270, produced by the interaction of the optical beam 120 with the PBL 180. This configuration would be useful, for example, if there is protective overcoat 220 on the top surface of the PBL 180 that prevents the charged-particle beam 110 from penetrating through to the active area of the pixels 190, or if in an embodiment comprising a fluorescent coating 200 (as described above), the fluorescent coating 200 is sufficiently thick to block fluorescent emission from the top surface of the coating 200 from being transmitted through the coating 200 to the pixels 190 in the PBL 180.

Not all embodiments require the use of a fiducial pattern 270, since both optical beam 120 and particle beam centroids can theoretically be found using simple image processing algorithms well-known to those skilled in the art on the areas where the beams strike the imaging array 180 array. The beams can strike the image imaging array 180 either sequentially or simultaneously, and a centroid-finding analysis may be performed either sequentially or simultaneously for the two beams, with the analysis performed either while the corresponding beam is striking the imaging array 180, or after a beam has struck the imaging array 180, and an image has been recorded of the incidence of the beam spot. However, the use of fiducial marks can improve the accuracy of an alignment procedure, since the fiducial mark shape and contrast can be better optimized for finding centroids algorithmically in comparison to using just the beam centroids, and beams hitting the sample at an angle (such as an optical beam as in FIGS. 1 and 3) may have asymmetrical shapes.

Sub-pixel resolution of the position of the centroids of the shadows of fiducials may be calculated using image processing algorithms well-known to those skilled in the art and used in machine vision applications and microscopy, as referred to above.

Therefore, referring to FIGS. 7A and 7B, some embodiments may optionally incorporate at least one fiducial mark 270 on the surface of the image imaging array 180. As shown in FIG. 7A, a fiducial 270 may be on the top surface of the fluorescent coating 200 so that it can be readily imaged using the charged-particle beam 110. It is also possible to place the fiducial 270 under a thin fluorescent coating 200 layer as shown in FIG. 7B. If fluorescent coating 200 is thin enough, its surface may conform to the fiducial 270, and thus the top surface of fluorescent coating 200 may be close to the size and shape of fiducial 270. The fiducial 270 may be sized such that it is smaller than the minimum optical beam spot 230 focused size, and the fiducial 270 may cast a shadow surrounded by light from the optical beam 120 or charged-particles from the particle beam 110, and such light around the edges of the shadow of fiducial 270 can be centered around the fiducial 270 to center the beam.

The shape of a fiducial 270 may be chosen to make centering of the beams 110, 120 easier in terms of increasing accuracy or speed of the alignment. For example, a cross or a star-shaped fiducial pattern 145 may allow integration of the optical irradiance detected by the image imaging array 180 in the quadrants or segments surrounding the center of the fiducial 270 to be integrated and equalized or balanced in order to center the optical beam 120 or find the center of a scanned particle beam 110 (e.g. while rastering the particle beam in a square shape). Or, the fiducial 270 may be sized to be larger than the optical beam 120, for example, in a ring shape as described below, so that the position of the optical beam 120 may be centered within the fiducial 270. In some embodiments, a fiducial 270 may be sized such that its shadows of the optical beam 120 may be seen as steep fall-offs of irradiance at the edges of a Gaussian beam distribution, as illustrated in FIGS. 8A and 8B, so that any shadows of the optical beam 120 by the fiducial 270 occur away from the center of the beam, and the shadows of the optical beam 120 can be centered around the brightest portion of the optical beam 120.

In many centroid-finding algorithms, a convenient shape for a fiducial mark 270 allowing high accuracy of centroid or edge finding is a simple square. A fiducial 270 may be positive or negative (opaque or transparent) with the surrounding area the opposite polarity. A positive fiducial 270 with a negative surrounding enables easy finding of beams 110, 120 outside the center of the fiducial 270 area, but in some cases it might be convenient to have a negative hole in a positive fiducial 270. For example, it may be convenient to find the centroid of a square fiducial 280, shown in FIG. 8C, using an open square center (or a circular or elliptical annulus), and then to align the optical beam 120 or charged-particle beam 110 or both within the open center of such a "doughnut" fiducial 270. An example of a square ring fiducial 280 is shown in FIG. 8C. FIG. 8A illustrates schematically an irradiance distribution of a Gaussian beam (typical of optical beam spots 230) incident on an imaging array 180. FIG. 8A schematically shows the extent of a circular beam in plan view on the surface of the imaging array 180. FIG. 8B indicates the irradiance as a function of position across the beam 110, 120 in the plane shown by the section line in the top part of FIG. 8A. FIG. 8C shows an optical beam spot 230 sized such that a shadow of the opaque ring fiducial 280 is cast onto the imaging array 180. With the optical beam spot 230 sized in this way, its center may be easily located by one or a combination of a number of techniques, including comparing the position of the peak irradiance of the optical beam spot 230 to the position of the shadow of the fiducial 280, or comparing the height of the response of the imaging array 180 at opposite boundaries of the square fiducial 280. This method may be most effective if the beam size and fiducial size are both several imaging-array pixels 190 in extent. Other concentric target shapes for fiducials 270 other than open squares may also be useful in facilitating the speed or accuracy of alignment.

The shape of a fiducial 270 may be a readily-identifiable shape for ease in finding it using the charged-particle microscope, and for identifying it manually or automatically when scanning the image at low or high magnifications. If there is more than one fiducial 270, multiple fiducials 270 may be spaced at multiple locations across the imaging array 180. Having multiple fiducials 270 will allow the PBL 180 to continue to be used even if one of the fiducials 270 is damaged somehow, such as by excess laser power, dirt, scratches, or ion beam damage. Multiple fiducials 270 may be uniquely shaped, or labeled in some other fashion, such as with a numbering scheme like on a finder microscope slide or TEM finder grid, so that the position of the fiducial 270 that is being used for a current alignment procedure can be unambiguously identified. For example, fiducials 270 may include a pattern in the shape of alphanumeric characters, or may be marked by, or associated by proximity with alphanumeric characters, as shown in the example of FIG. 6.

Alignment Using PBL and Chamber-Scope

A fluorescent coating 200 material over the PBL 180 may be sufficiently thick to block or absorb the fluorescent emission from the fluorescent coating 200 when it is stimulated on its top surface by the charged-particle beam 110. The fluorescent emission is not transmitted through the thickness of the coating 200 to the pixels 190 in the PBL 180. The fluorescent coating 200 may be substantially opaque to the fluorescent emission wavelength, while it is still substantially transparent to the optical beam 120, because, for instance, the optical beam 120 may be at a different optical wavelength, thus allowing penetration of the optical beam 120 through the fluorescent coating 200 to the imaging array 180. Thus while PBL 180 can be used to detect the position of the optical beam 120, it cannot simultaneously detect the position of the charged-particle beam 110.

In this situation, then, a separate optical imaging device, or chamber-scope (not shown), such as a telescope, microscope or borescope mounted inside the sample chamber of the microscope 100, may be used to image the surface of the PBL 180 and to detect the optical emission from the fluorescent coating 200 stimulated by the charged-particle beam 110 incident on the top side of the fluorescent coating 200. The image of the surface of the PBL 180 taken using the chamber-scope, which will show the charged-particle beam 110 location, can then be compared with an electronic image 250 from the PBL 180, which detects and shows the position and size of the optical beam 120 as it intersects the PBL 180, and thus the relative alignment of the beams and focusing of one or more of the beams can be accomplished after suitable correction for angles, magnification, etc.

Imaging Array Pixel Resolution

Preferably, the size of a pixel 190 in the imaging array 180 should be smaller than the incident spot size of any of the incident beams, the charged-particle beam 110, or the optical beam 120. However, even if the imaging array 180 pixel size is larger than the spot size of one or more incident beams, alignment of the incident beams is still possible, within the spatial resolution limitation of the size of the pixels 190.

Sub-pixel resolution of a calculated beam position is also achievable, for example if the optical beam spot 230 overlaps multiple pixels 190. As a simple example, if an optical beam spot 230 overlaps two neighboring pixels 190, but the centroid of the beam spot 230 is shifted toward the center of one of the pixels 190, then the relative responses of the two pixels 190 to the beam spot 230 will differ and can be used to calculate the position of the centroid of the beam 120. The pixel 190 that is receiving more beam power (i.e., the pixel 190 toward which the centroid of the beam spot 230 is shifted) will have a higher output than the other, and the ratio of the two electronic outputs of the pixels 190 can be calculated. If the ratio is unity (same output from the two pixels 190), then the beam, if symmetrical, may be deduced to be approximately centered between the two pixels 190. This principle can be extended to non-neighboring pixels 190 and to two-dimensional arrays of pixels 190 in a simple fashion, as will be appreciated by those skilled in the art.

Example Alignment Procedures

One embodiment of a method for alignment of an optical beam with a charged-particle beam using apparatus and techniques of the present invention is illustrated in FIG. 9. Many, if not all, of the steps of this method may be performed under computerized automation.

Referring now to FIG. 9, an alignment method 900 according to the present invention is described. A PBL 180 apparatus in one of the variations described herein is provided in step 902. The PBL is mounted in the charged-particle beam microscope vacuum chamber in step 904 so that the charged-particle beam can be operated in an evacuated state. Once the charged-particle beam and optical beams can both be operated, a rough alignment is performed in step 906 to position the PBL within the microscope so that both optical and charged-particle beam spots are incident on the PBL within the extent of the imaging array 180, i.e. so that the PBL can be used to form electronic images of both the optical and charged-particle beam spots without further repositioning of the PBL.

Next, in step 908, the charged-particle beam spot 240 is placed at a convenient reference position on the PBL. As shown in FIGS. 4 and 5, a convenient position may be near the center of the imaging array 180, but this reference position may be chosen anywhere that is convenient for use in subsequent steps. Positioning of the charged-particle beam spot 240 on PBL 180 may be accomplished either by a positioning of the PBL within the microscope 100 e.g. using motion of the sample stage 140, if the PBL is mounted on stage 140, or using electronic steering of the charged-particle beam 110 using the beam control functions of charged-particle microscope 100. Also, it should be noted that step 906 (positioning the two beam spots on the PBL array simultaneously) and step 908 (positioning the charged-particle spot at a convenient position within the PBL pixel array) may be interchanged in the sequence they are performed, performed more than once, or possibly alternated in an iterative fashion to optimize the positions of the two spots for accuracy or automation.

Once both beam spots can be sensed by PBL 180 and a reference position has been chosen, the location of the optical spot center on the array is found in step 910. This location may be found with sufficient accuracy to permit prediction of a suitable distance and direction of motion of the optical beam to drive the optical beam spot 230 to align it on PBL 180 with the center of the charged-particle beam spot 240. In step 912, the nanomanipulator 135 that is used to position the optical accessory is operated to perform this motion of the optical beam 120 to overlap the beams at the reference position. If desired, the nanomanipulator 135 may be moved in a coordinated motion to translate the optical beam spot 240 along the surface of the PBL 180 without altering focus of the optical beam 120. Step 912 may be iterated or repeated to position the two beams centroids to the accuracy required.

As described earlier, the PBL can also be used to adjust the focus of the optical beam spot e.g. by minimizing the area of the optical spot 230 on the imaging array 180. Since focusing the optical beam spot can also be performed using a different method, such as by observing effects on a sample during processing, without using the PBL, steps 914 and 916 are indicated by dashed lines as being optional within this alignment method. If the PBL is used to perform focusing of the optical beam spot, then in step 914 the nanomanipulator 135 is operated to change the position of the optical beam in the focus direction (e.g. along the axis of the optical accessory 125) while attempting to maintain optimum overlap with the charged-particle beam spot 240. In practice, motions of the nanomanipulator in one axis may have a small interaction with other directions, and thus in step 916, the overlap is requantified to determine whether the two beam spots are still aligned within the desired accuracy, after performing the focusing operation 914. If after focusing, the optical beam spot position needs to be readjusted, the method goes back to 912 to perform a shift of the proper direction and amount. These steps 912, 914, and 916 can thus be iterated to simultaneously optimize optical beam spot position and focus. Once either the optical and charged-particle spot positions are optimized (after step 912), or both positions and focus are optimized (after step 916 is satisfied), then the alignment procedure is complete, step 918, and the PBL can be moved out of the way or removed entirely from the microscope as required.

As described earlier, the PBL 180 may be mounted close to a sample 130 for convenient alignment, increased accuracy, and rapid rechecking of alignment and focus. Alternatively, the PBL 180 may be separately placed in or on a sample holder, mounted on the sample stage 140 inside the charged-particle beam microscope, and without a specimen inside the microscope 100, in order to align the optical beam 120 with the charged-particle beam 110 and to focus the optical beam 120. An embodiment of a method 1000 of this type, allowing the removal of the PBL 180 before mounting a sample 130, is illustrated in FIG. 10.

Referring now to FIG. 10, method 1000 for pre-aligning optical and charged-particle beams before the sample is loaded begins in step 1002 and proceeds with the step 1004 of mounting the PBL in the microscope chamber. In step 1006, a reference position is chosen charged-particle beam spot either using the output of the PBL 180 or using the imaging and beam controls of microscope 100. This reference position may be stored in a memory as part of step 1006 for future reference in the alignment procedure. Note that if the PBL 180 is not used to find the full 3-D position of the charged-particle beam focused spot, then any convenient sample can be used for step 1006, and in fact the PBL 180 can be inserted after step 1006; i.e. step 1004 and step 1006 can be interchanged in sequence if the PBL is not used to perform step 1006.

In step 1008, the PBL 180 is used in one of the ways described herein to align and possibly focus the optical beam 120 for coincidence with the charged-particle beam 110 such that the optical beam spot 230 and charged-particle beam spots 240 overlap on the same point in space. Step 1008 may comprise, for example, some or all of the steps of alignment procedure 900 described in FIG. 9.

After the beam alignment 1008 has been performed, then the PBL can be removed from the microscope chamber as in step 1010 (or possibly simply shifted out of the way within the chamber), and a real sample 130 that is to be studied is loaded into the microscope 100 in step 1012. In step 1014, sample 130 is moved such that the area of interest is positioned at the reference position where the optical and charged-particle beams have been prealigned to overlap. Then processing of the sample using one or both of the overlapping beams can proceed in step 1016, and method 1000 that enables prealignment is complete in step 1018.

In some embodiments, the step 1006 of locating the 3-D reference position (a point in space) of the charged-particle beam spot 240 may be done by identifying the electronic settings for the position and focus of the charged-particle beam 110 in the control system for the charged-particle beam microscope 100, and storing these settings (e.g. by saving in a memory of the control system of the charged-particle beam microscope 100). After the position and focus settings have been stored, a sample 130 can then be mounted on a sample holder 145 that can be mounted on microscope stage 140, and then sample 130 is loaded in step 1012 into the charged-particle beam microscope 100 to be imaged by the charged-particle beam 110. Step 1014 comprises bringing the position of the sample 130 to the point where both beams are focused by moving the microscope stage 140 until the surface of the sample 130 is at the same location as the previously stored location for focus and alignment.

Variations in the Alignment Procedure

Although preferred embodiments provided by the present invention have been described in detail, and several alternative forms of the invention have been shown, it will be apparent to those skilled in the art that the principles taught herein may be implemented in many other ways and by using methods and systems differing in a number of details, without departing from the scope or spirit of the invention. For example, in some alternative implementations, the steps performed in a method may occur out of the order noted in the figures. For example, two steps shown in succession may be executed substantially concurrently, or sometimes in reverse order, depending on the functionality involved. As mentioned previously, some of the steps may be implemented manually by the user of the method or apparatus, and some may be automatically performed by a computing system. Besides an embodiment that is partly manual, the present invention can also take the form of an entirely hardware embodiment, an entirely software embodiment, or an embodiment combining some software and some hardware aspects.

For example, a method for aligning a charged-particle beam 110 and optical beam 120 may have a first step of locating the position of the charged-particle beam 110, or a first step of locating the position of the optical beam 120, before the charged-particle beam 110 is located. Depending on whether a fiducial 270 is used in conjunction with the PBL 180, it may be more efficient, accurate, or convenient to perform one of these two orders of method steps.

A calibration procedure to locate the position of the PBL 180 in reference to the sample 130 or to coordinates of the microscope stage 140 may optionally be performed as part of the method. The calibration procedure may be a separate procedure performed before any samples 130 are loaded, or it could be done every time a sample 130 is loaded, and therefore calibration steps might be considered part of the alignment procedure.

For example, there may be an initial calibration required to accurately locate the actual position of the fiducial 270 on the image imaging array 180 before using it for alignment. Of course, more than one fiducial 270 may be present. This initial calibration may only be required once, not every time a sample 130 is loaded for alignment of one or the other of the charge-particle beam 110 or the optical beam 120. A special calibration and alignment sample (not shown) may be used for beam alignment; e.g. on the same sample holder 145, on a different holder, or on the stage 140, and then the actual sample 130 for study or processing by the combined optical beam 120 and charged-particle beam 110 may be moved into position, leaving the calibration and alignment sample (not shown) aside. Certain materials having properties or shapes might be desirable for a special calibration and alignment sample 130 to have that would make it easier to perform the alignment using the PBL 180.

A calibration and alignment sample (not shown) may optionally be removed between the execution of the alignment procedure and the subsequent processing of a real sample 130, such as by venting the chamber and exchanging the sample holder 145 to put an actual sample 130 in place.

Figure 1:
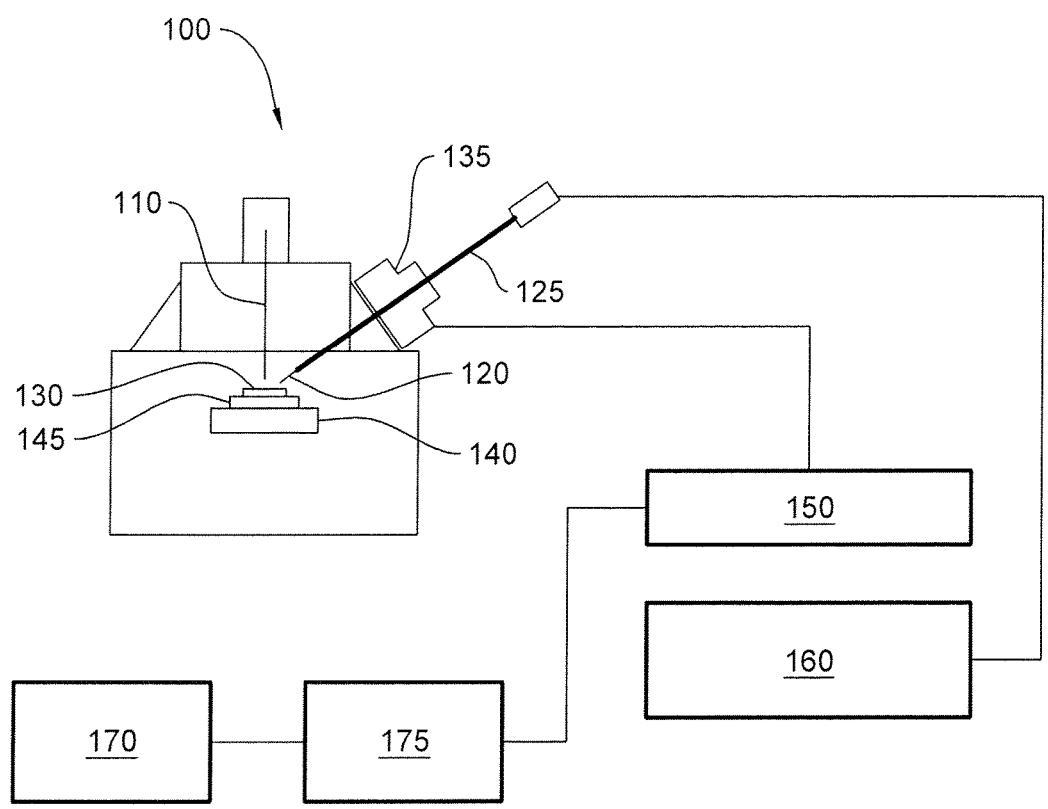
FIG. 1 is a schematic diagram showing an example of an SEM with one optical beam accessory, such as a laser sample heating probe.

In actual practice, there may not be good control over the height of the surface of the sample 130 in comparison to the height of the imaging array 180 surface, or it may be difficult to achieve the same height of these two surfaces when mounting the sample 130. Thus certain embodiments of an alignment method may include one or more steps to take this into account. For example, in a common procedure using charged-particle microscopes 100, the height positions of the stage 140 when the charged-particle beam 110 is focused on the sample 130 and imaging array 180 are adjusted to match using a high magnification setting for imaging. The charged-particle image focus is set to a particular value, and because the depth of focus is smaller at high magnification, the stage 140 can be moved in the Z axis so that the charged-particle image is in focus for both sample 130 and imaging array 180 surface. Accuracy of setting the Z position may be important, because in the common case where the optical beam 120 is coming in at an angle with respect to the charged-particle beam 110 as shown in FIGS. 1 and 3, the beam positions in the X-Y axes of the stage 140 (i.e., the plane of the sample 130) vary as different functions (approximating linear for straight optical and particle beams) of (stage/microscope) Z height.

Additional steps may be required to compensate for a difference in tilt of the surface of the sample 130 from the PBL 180 surface, since the plane of the surface of the sample 130 may not be guaranteed to be parallel to the plane of the imaging array 180. In most cases, alignment of the beams 110, 120 on the imaging array 180 should be sufficient, as long as any difference in height of the surface of the sample 130 from the imaging array 180 (as discussed in the previous paragraph) and the tilt of the imaging array 180 surface are both taken into account.

None of the description in this application should be read as implying that any particular element, step, or function is an essential element which must be included in the claim scope; the scope of patented subject matter is defined only by the allowed claims. Moreover, none of these claims are intended to invoke 35 U.S.C. Section 112(f) unless the exact words "means for" are used, followed by a gerund. The claims as filed are intended to be as comprehensive as possible, and no subject matter is intentionally relinquished, dedicated, or abandoned.

We claim:

1. A method for alignment of a charged-particle beam and an optical beam in a charged-particle instrument, where the charged-particle instrument comprises a pixelated beam locator (PBL) intersected by the charged-particle beam at a charged-particle beam spot and by the optical beam at an optical beam spot; the method comprising:

positioning the PBL to make both the charged-particle beam and the optical beam incident on the PBL;

positioning the charged-particle beam spot to a reference location on the PBL; and aligning the optical beam spot on the PBL with the charged-particle beam spot at the reference location on the PBL.

2. The method of claim 1, where the PBL has a different response to the optical beam spot and the charged-particle beam spot; the method further comprising distinguishing the optical beam spot from the charged-particle beam spot according to the different responses of the PBL to the optical beam spot and the charged-particle beam spot.

3. The method of claim 1, where the method further comprises distinguishing the optical beam spot from the charged-particle beam spot by switching the optical beam on and off while the charged-particle beam is maintained continuously on.

4. The method of claim 1, where the method further comprises distinguishing the optical beam spot from the charged-particle beam spot by switching the charged-particle beam on and off while the optical beam is maintained continuously on.

5. The method of claim 1, where the method further comprises distinguishing the optical beam spot from the charged-particle beam spot by modulating the optical beam and the charged-particle beam as different functions of time.

6. The method of claim 1, where the PBL comprises pixels, and further comprising:
detecting the number of pixels activated by the optical beam spot; and
focusing the optical beam to minimize the number of pixels activated.

7. The method of claim 1, further comprising placing at least one fiducial mark on the PBL.

8. The method of claim 7, further comprising identifying an optical shadow of the at least one fiducial mark in an electronic image formed by the PBL.

9. The method of claim 7, further comprising indexing the at least one fiducial mark with unique labels.

10. The method of claim 1, where positioning the charged-particle beam spot to the reference location on the PBL further comprises calculating the position of the centroid of the charged-particle beam spot on the PBL.

11. The method of claim 7 further comprising making an initial calibration to accurately locate the actual position of the fiducial mark on the PBL before using the PBL for alignment.

12. The method of claim 1, where aligning the optical beam spot further comprises calculating the position of the centroid of the optical beam spot on the PBL.

13. The method of claim 1, where the PBL further comprises a fluorescent coating; the method further comprising detecting the location of the charged-particle beam spot on the PBL by detecting, using the PBL, fluorescence stimulated in the fluorescent coating by the charged-particle beam spot.

14. The method of claim 1, where the PBL further comprises a fluorescent coating; the method further comprising: detecting the location of the charged-particle beam spot by detecting, using a chamber scope, fluorescence stimulated in the fluorescent coating by the charged-particle beam spot.

15. The method of claim 1, where the PBL is capable of forming electronic images of both the charged-particle beam spot and the optical beam spot.

16. The method of claim 15, where aligning the optical beam spot on the PBL with the charged-particle beam spot at the reference location further comprises moving the optical beam spot with a closed-loop procedure to make the electronic images of the optical beam spot and of the charged-particle beam spot substantially coincident.

17. The method of claim 15, where aligning the charged-particle beam spot to the reference location on the PBL further comprises moving the charged-particle beam spot with a closed-loop procedure to make the electronic images of the optical beam spot and of the charged-particle beam spot substantially coincident.

18. The method of claim 1, where the optical beam spot is produced by a laser; the method further comprising adjusting the power of the laser to minimize the size of an electronic image formed by the PBL of the optical beam spot.

19. The method of claim 1, further comprising adjusting the charged-particle beam current to minimize the size of an electronic image formed by the PBL of the charged-particle beam spot.

20. A method for alignment of a charged-particle beam and an optical beam in a charged-particle instrument, where the charged-particle instrument comprises a moveable stage for supporting a sample, and a pixelated beam locator (PBL) intersected by the charged-particle beam at a charged-particle beam spot and by the optical beam at an optical beam spot; the method comprising:
positioning the PBL to make both the charged-particle beam spot and the optical beam spot incident on the PBL;
positioning the charged-particle beam spot to a reference location on the PBL;
aligning the optical beam spot on the PBL with the charged-particle beam spot at the reference location on the PBL; and
translating the stage supporting the sample to expose the sample to the optical beam spot and the charged-particle beam spot, without altering the focus or position of the optical beam spot or of the charged-particle beam spot.

21. The method of claim 20 where the PBL and the sample, respectively, each have a surface, and the surface of the PBL and the surface of the sample are substantially coplanar.

22. The method of claim 20, where the PBL forms an electronic image of each of the optical beam spot and the charged-particle beam spot, and where aligning the optical beam spot on the PBL with the charged-particle beam spot at the reference location further comprises moving the optical beam spot with a closed-loop procedure to make the electronic images of the optical beam spot and charged-particle beam spot substantially coincident.

23. The method of claim 20, where the PBL forms an electronic image of each of the optical beam spot and the charged-particle beam spot, and where positioning the charged-particle beam spot to a pre-determined reference location on the PBL further comprises moving the charged-particle beam spot with a closed-loop procedure to make the electronic images of the optical beam spot and the charged-particle beam spot substantially coincident.

24. The method of claim 20, where the PBL has a different response to the optical beam spot from the charged-particle beam spot; the method further comprising distinguishing the optical beam spot from the charged-particle beam spot according to the different responses of the PBL to the optical beam spot and the charged-particle beam spot.

25. The method of claim 20, where the method further comprises distinguishing the optical beam spot from the charged-particle beam spot by switching the optical beam on and off while the charged-particle beam is maintained continuously on.

26. The method of claim 20, where the method further comprises distinguishing the optical beam spot from the charged-particle beam spot by switching the charged-particle beam on and off while the optical beam is maintained continuously on.

27. The method of claim 20, where the method further comprises distinguishing the optical beam spot from the charged-particle beam spot by modulating the optical beam and the charged-particle beam as different functions of time.

28. The method of claim 20, where the PBL comprises pixels, and further comprising:
    detecting the number of pixels activated by the optical beam spot; and
    focusing the optical beam to minimize the number of pixels activated.

29. The method of claim 20, further comprising removing the PBL from the charged-particle instrument before translating the stage supporting the sample to expose the sample to the optical beam spot and the charged-particle beam spot.

30. The method of claim 20, further comprising placing at least one fiducial mark on the PBL.

31. The method of claim 30, further comprising identifying an optical shadow of the at least one fiducial mark in an electronic image formed by the PBL.

32. The method of claim 30, further comprising making an initial calibration to accurately locate the actual position of the fiducial mark on the PBL before using the PBL for alignment.

33. The method of claim 30, further comprising indexing the at least one fiducial mark with unique labels.

34. The method of claim 20, where positioning the charged-particle beam spot to the reference location on the PBL further comprises calculating the position of the centroid of the charged-particle beam spot on the PBL.

35. The method of claim 34, where the PBL comprises pixels, and where positioning the charged-particle beam spot at the reference location further comprises calculating the position of the centroid of the charged-particle beam spot to a sub-pixel resolution.

36. The method of claim 20, where positioning the optical beam spot to the reference location on the PBL further comprises calculating the position of the centroid of the optical beam spot on the PBL.

37. The method of claim 26, where the PBL comprises pixels, and where positioning the optical beam spot to the reference location on the PBL further comprises calculating the position of the centroid of the optical beam spot on the PBL to a sub-pixel resolution.

38. The method of claim 20, where the PBL further comprises a fluorescent coating; the method further comprising detecting the location of the charged-particle beam spot on the PBL by detecting, using the PBL, fluorescence stimulated in the fluorescent coating by the charged-particle beam spot.

39. The method of claim 20, where the PBL further comprises a fluorescent coating; the method further comprising detecting the location of the charged-particle beam spot by detecting, using a chamber scope, fluorescence stimulated in the fluorescent coating by the charged-particle beam spot.

40. The method of claim 20, where the optical beam spot is produced by a laser; the method further comprising adjusting the power of the laser to minimize the size of an electronic image formed by the PBL of the optical beam spot.

41. The method of claim 20, further comprising adjusting the charged-particle beam current to minimize the size an electronic image formed by the PBL of the charged-particle beam spot.

* * * * *